United States Patent [19]
Owada et al.
[11] Patent Number: 5,068,710
[45] Date of Patent: Nov. 26, 1991

[54] SEMICONDUCTOR DEVICE WITH MULTILAYER BASE CONTACT

[75] Inventors: Nobuo Owada, Ohme; Mitsuaki Horiuchi, Fuchu; Masatoshi Tsuneoka, Ohme; Tadayuki Taneoka, Akishima, all of Japan

[73] Assignee: Hitachi, Ltd., Tokyo, Japan

[21] Appl. No.: 396,687

[22] Filed: Aug. 22, 1989

Related U.S. Application Data

[63] Continuation of Ser. No. 63,023, Jun. 17, 1987, abandoned.

[30] Foreign Application Priority Data

Jun. 18, 1986 [JP] Japan ................................ 61-140064

[51] Int. Cl.[5] ...................... H01L 23/48; H01L 29/46; H01L 29/04; H01L 29/06

[52] U.S. Cl. ........................................ 357/71; 357/67; 357/34; 357/59; 357/56

[58] Field of Search ................... 357/71, 67, 34, 59 G, 357/59 H, 59 I, 56

[56] References Cited

U.S. PATENT DOCUMENTS 4,477,962 10/1984 Godejahn, Jr. .................. 357/59 G
4,481,706 11/1984 Roche .............................. 357/59 H
4,933,737 6/1990 Nakamura et al. .................. 357/55

FOREIGN PATENT DOCUMENTS 175726 10/1984 Japan .

*Primary Examiner*—Rolf Hille
*Assistant Examiner*—Robert P. Limanek
*Attorney, Agent, or Firm*—Antonelli, Terry, Stout & Kraus

[57] ABSTRACT

On a semiconductor film to function as a lead-out electrode of a semiconductor element, a metal silicide film and a metal nitride film are successively provided, whereby alloying and inferior contact resistances attributed to heat during wiring with aluminum can be effectively suppressed, so that the reliability of a semiconductor device can be enhanced.

43 Claims, 2 Drawing Sheets

15 14 12a 11(p+) 12 13 5(n+) 14 6 13 9 14 7(n+) 13 8 10(p+) 10(p+) 9 3(n-) 4(p) 2(n+) 1(p-)

24
9
25
14
15
13
12B
21
18
24
21
14
15
12B
13
9
25
24
13
21
12B
15
14
18
24
21
13
12B
15
14
25
24
9
1(p)
23
11B
20
17
20
23
11B
11A
22
19
17
16
19
22
11A

SEMICONDUCTOR DEVICE WITH MULTILAYER BASE CONTACT

This is a continuation of application Ser. No. 07/063,023, filed June 17, 1987 now abandoned.

BACKGROUND OF THE INVENTION

The present invention relates to a semiconductor device, and more particularly to a technique which is effective when applied to the formation of an electrode in the case of employing a semiconductor film for leading out the electrode.

In, for example, a bipolar LSI of SICOS (Side Wall Base Contact) structure, the base of a bipolar transistor is led out by a boron-doped polycrystalline Si (silicon) film, on which an Al-alloy electrode is formed (refer to, for example, the official gazette of Japanese Patent Application Laid-open No. 1556/1981).

Besides, the emitter, base and collector of a bipolar transistor are led out by multilayer films each consisting of a polycrystalline silicon film and platinum silicide (PtSi), and aluminum electrodes (wiring layers) are formed on the polycrystalline silicon films (described in, for example, IEEE JOURNAL OF SOLID-STATE CIRCUITS, VOL. SC-15, No. 4, AUGUST 1980, pp. 455–458).

Hereinbelow, for the sake of convenience, the expression "electrode" shall sometimes refer to, for example, a lead-out conductor layer which is connected near the contact hole of an aluminum wiring layer or to a base, emitter or collector or a source or drain diffused layer.

SUMMARY OF THE INVENTION

The inventors studied the electrode formation on the polycrystalline Si film and the electrode formation on the multilayer film consisting of the polycrystalline Si film and platinum silicide. The technique studied by the inventors, which was not known, will be outlined below:

According to the results of experiments conducted by the inventors, a polycrystalline Si film doped with boron is far more difficult with respect to controlling the growth of crystal grains as compared with using a polycrystalline Si film doped with arsenic or phosphorus, and that crystal grain growth of the former hardly takes place in the manufacturing process of an LSI. As a consequence, the boron-doped polycrystalline Si film remains in an unstable state in which the film itself stores large quantities of grain boundary energy. Therefore, in the case where an electrode made of an Al-alloy film is formed directly on the boron-doped polycrystalline Si film, a problem arises in that the electrode is alloyed with the polycrystalline Si film during the formation thereof, thereby resulting in the manufacture of a defective unit.

For such a reason, in a bipolar LSI wherein a base is led out by the boron-doped polycrystalline Si film, after the polycrystalline Si film has been formed, an electrode made of an Al-alloy film is formed thereon through a platinum silicide (PtSi) film.

The inventors, however, have found out that, even in the case where the electrode made of the Al-Si-alloy film is formed on the polycrystalline Si film through the platinum silicide film as stated above, the refractory characteristics of the electrode is not sufficient, so the alloying between the electrode and the polycrystalline Si film is prone to occur during the formation of the Al-alloy electrode. Further, in a case where a transition metal or an alloy thereof, such as W, Mo or TiW, is used instead of the platinum silicide film, the refractory characteristics is still insufficient because the material itself has the property wherein it easily reacts with Si to form a silicide.

An object of the present invention is to provide a technique capable of enhancing the refractory characteristics of an electrode.

The above and other objects and novel features of the present invention will become apparent from the description of this specification and the accompanying drawings.

A typical aspect of performance of the present invention is as summarized below:

A metal silicide film and a metal nitride film which is electrically conductive are successively disposed on a semiconductor film, and an electrode is disposed on the metal nitride film.

According to the above expedient, the alloying between the semiconductor film and the electrode is effectively prevented especially by the metal nitride film, so that the refractory characteristics of the electrode can be enhanced. Moreover, the contact resistance of the electrode can be stabilized by the metal silicide film.

DESCRIPTION OF THE PREFERRED EMBODIMENTS

Now, the construction of the present invention will be described on the basis of embodiments with reference to the drawings.

Embodiment I

Figure 1:
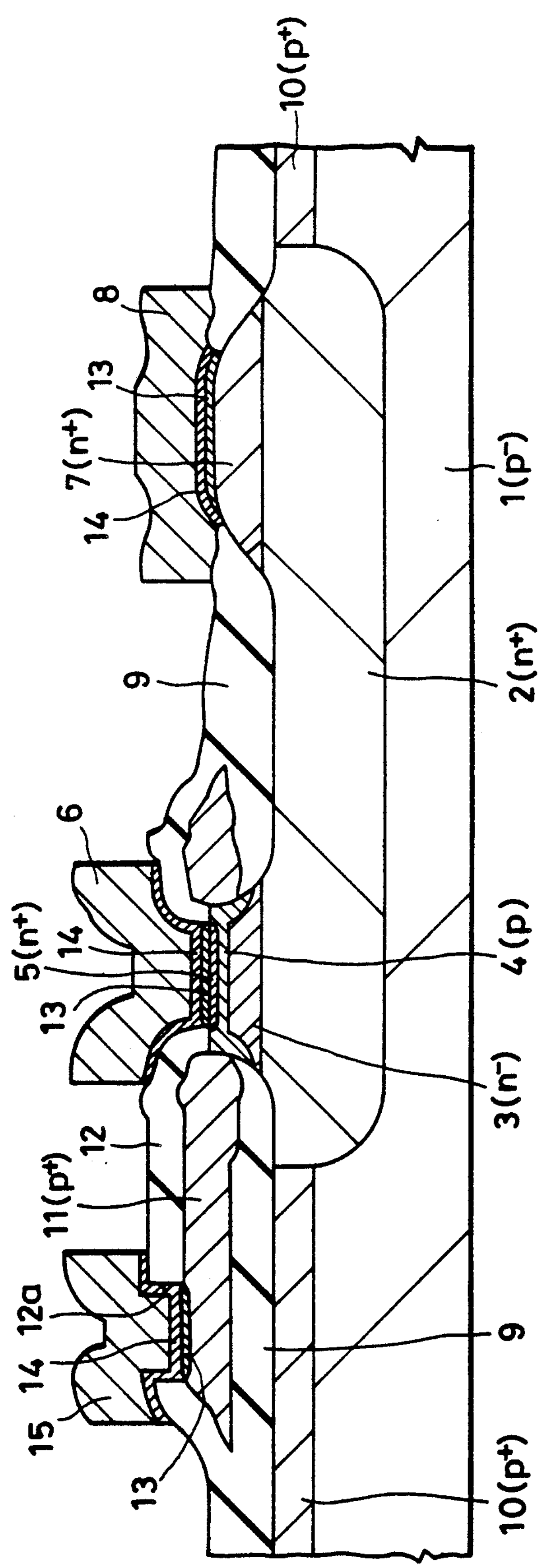
FIG. 1 is a sectional view which shows a bipolar LSI of SICOS structure according to Embodiment I of the present invention.

As illustrated in FIG. 1, in a bipolar LSI of SICOS structure according to Embodiment I, a semiconductor substrate 1 such as a $p^-$-type Si substrate by way of example is provided with a buried layer 2 of $n^+$-type. A Si epitaxial layer 3 of, for example, $n^-$-type is disposed on the semiconductor substrate 1. The part of the Si epitaxial layer 3 overlying one end of the buried layer is etched into the shape of a mesa, on which a base region 4 of p-type is disposed. Further, an emitter region 5 of $n^+$-type is formed in the base region 4. An emitter electrode 6 made of, for example, an Al-Si-alloy film is disposed on the emitter region 5 through a metal silicide film 13 and a metal nitride film 14 which will be described later. A collector region of n-type is configured by the Si epitaxial layer 3 between the base region 4 and the buried layer 2. Numeral 7 denotes an electrode lead-out region of $n^+$-type which is connected with the buried layer 2, and a collector electrode 8 made of, for example, an Al-Si-alloy film is formed on the electrode lead-out region 7 through a metal silicide film 13 and a metal nitride film 14 to be described later.

Meanwhile, a field insulator film 9 such as an $SiO_2$ film, by way of example, is formed around the mesa-shaped part of the Si epitaxial layer 3, whereby the elements of the LSI are isolated. Under the field insulator film 9, a channel stopper region 10 of $p^+$-type is formed, thereby insert preventing a parasitic channel from appearing. In addition, a polycrystalline Si film 11 of $p^+$-type which is heavily doped with boron by way of example is formed on the field insulator film 9 so as to be connected with the base region 4, whereby the base is led out. On the surface of the polycrystalline Si film 11, an insulator film 12, for example, $SiO_2$ film which is formed by, for example, the thermal oxidation of this polycrystalline Si film 11 is provided continuously to the field insulator film 9.

A contact hole 12a is provided in the part of the insulator film 12 corresponding to one end of the polycrystalline Si film 11. Through this contact hole 12a, the polycrystalline Si film 11 is overlaid with a metal silicide film 13 such as a platinum silicide film or palladium silicide film having a thickness of about 200 Å, by way of example, and a metal nitride film 14 such as a titanium nitride (TiN) film having a thickness of about 1000 Å, by way of example, and a base electrode 15 made of an Al-Si-alloy film by way of example is formed on the metal nitride film 14. The metal nitride film 14 is a ceramic having an electric conductivity, which is very stable thermally, has excellent refractory characteristics and which also exhibits a low reactivity with Si. Therefore, the metal nitride film 14 can effectively prevent the occurrence of the alloying of the electrode 15 with the polycrystalline Si film 11 at the step of forming this electrode, and it can consequently enhance the refractory characteristics of the electrode. Accordingly, enhancement in the reliability of the electrode can be achieved. Furthermore, owing to the metal silicide film 13, the contact resistance of the electrode 15 with respect to the polycrystalline Si film 11 can be stabilized. In the case where the metal silicide (PtSi) film 13 and the metal nitride (TiN) film 14 are formed on the polycrystalline Si film 11 in the order mentioned, the contact resistance of the aluminum electrode (wiring layer) 15 remains constant for above 10 hours in spite of annealing at 475° C.

Next, a method of manufacturing the bipolar LSI according to the embodiment I will be described.

First, as illustrated in the drawing, a buried layer 2, a Si epitaxial layer 3, a field insulator film 9, a channel stopper 10 and a boron-doped polycrystalline Si film 11 are formed, whereupon the surface of the Si epitaxial layer 3 is thermally oxidized in the state in which it is covered with an oxidation impermeable film (not shown) such as an $Si_3N_4$ film, by way of example, thereby to form an insulator film 12 on the surface of the polycrystalline Si film 11. Subsequently, an electrode lead-out region 7 is formed within the Si epitaxial layer 3 by, for example, the selective diffusion of phosphorus, whereupon a p-type impurity and an n-type impurity are successively ion-implanted, by way of example, thereby to successively form a base region 4 and an emitter region 5 within the Si epitaxial layer 3. Subsequently, the predetermined parts of the insulator film 12 are etched and removed to form contact holes 12a. Subsequently, a metal film such as a platinum film or palladium film by way of example is formed on the whole surface of the resulting structure by, for example, evaporation and is sintered by a predetermined annealing, whereupon the unreacted metal film is etched and removed with, for example, aqua regia (a mixed solution consisting of HCl and $HNO_3$), thereby to form metal silicide films 13 such as platinum silicide films or palladium silicide films on the parts of the polycrystalline Si film 11, the emitter region 5 and the electrode lead-out region 7 corresponding to the contact holes 12a. Subsequently a metal nitride film 14 such as a titanium nitride film by way of example is formed on the whole surface by, for example, sputtering, whereupon an Al-Si-alloy film, for example, is further formed on the whole surface of the metal nitride film 14. These films are successively patterned into predetermined shapes by, for example, dry etching, thereby to form electrodes 6, 8 and 15. Then, an intended bipolar LSI is completed as shown in the drawing.

Embodiment II

Figure 2:
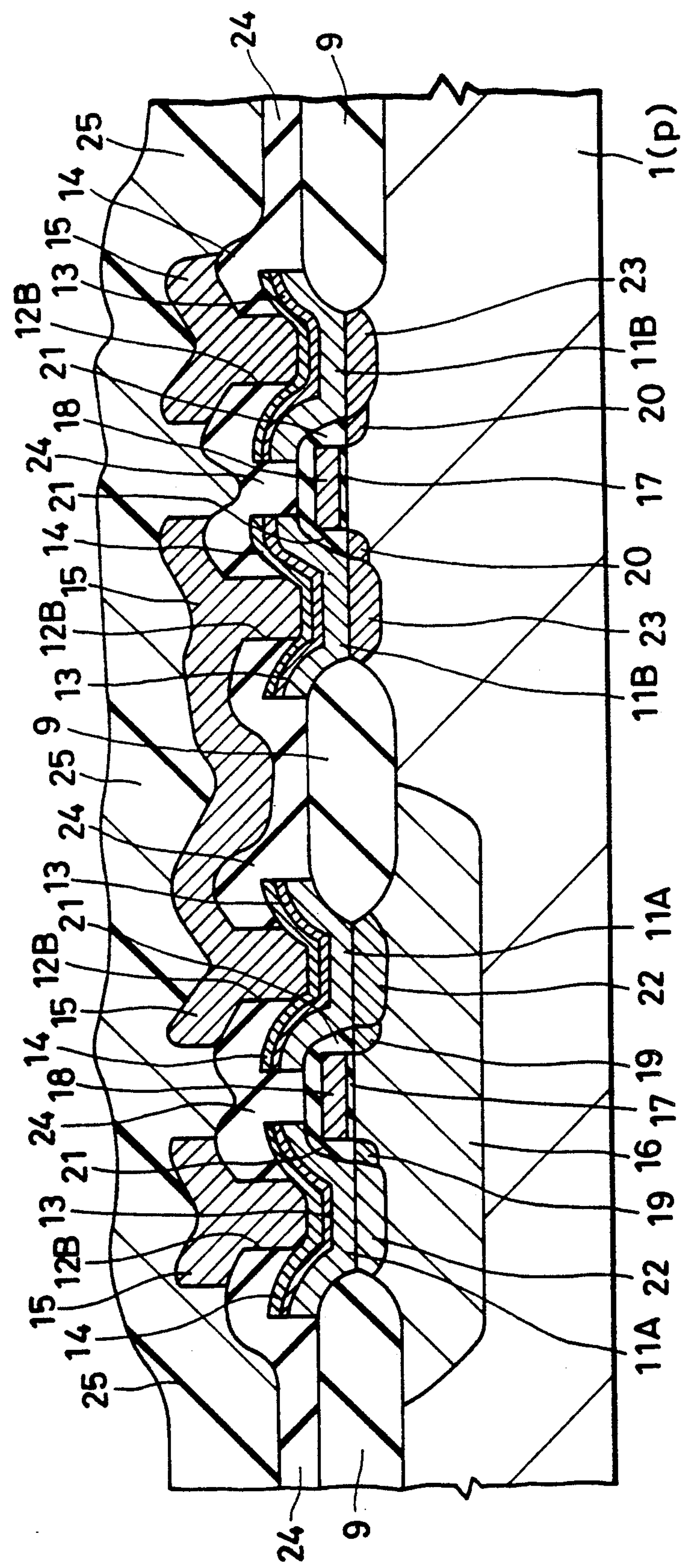
FIG. 2 is a sectional view which shows complementary metal-oxide semiconductor field effect transistors (CMOSFETs) according to Embodiment II of the present invention.

As illustrated in FIG. 2, in complementary metal-oxide semiconductor field effect transistors (hereinbelow, abbreviated to CMOSFETs) according to Embodiment II, a semiconductor substrate 1 such as a $p^{--}$-type Si substrate by way of example is provided with an n-type well region 6. A field insulator film 9 made of, for example, an $SiO_2$ film is disposed on the selected area of the surface of the semiconductor substrate 1. The active region of the n-type well region 16 is overlaid with a gate insulator film 17 which is made of an $SiO_2$ film, a gate electrode 18 which is made of a polycrystalline Si film formed by, e.g., CVD, a p-type diffused layer 19 which is formed by the ion implantation of boron (B), a side wall 21 which is made of an $SiO_2$ film formed by CVD, and $p^+$-type source and drain diffused layers 22 which are formed by the ion implantation of boron (B), whereby a p-type MOSFET of lightly doped drain (hereinbelow, abbreviated to "LDD") structure is constructed. Meanwhile, likewise to the p-type MOSFET, the active region of the other region than the N-type well region 16 is overlaid with a gate insulator film 17 which is made of an $SiO_2$ film, a gate electrode 18 which is made of a polycrystalline Si film, an $n^{--}$-type diffused layer 20 which is formed by the ion implantation of phosphorus (P), a side wall 21 which is made of an $SiO_2$ film, and $n^+$-type source and drain diffused layers 23 which are formed by the ion implantation of arsenic (As), whereby an n-type MOSFET of LDD structure is constructed. Polycrystalline Si films of $p^+$-type 11A which are heavily doped with, e.g., boron (B) are disposed on the p-type source and drain diffused layers 22 of the p-type MOSFET, while polycrystalline Si films of $n^+$-type 11B which are heavily doped with, e.g., phosphorus (P) are disposed on the $n^+$-type source and drain diffused layers 23 of the n-type MOSFET, whereby the sources and drains of both MOSFETs are respectively led out. On each of the polycrystalline Si films 11A and 11B, a metal silicide film 13 which is a platinum silicide film about 200 Å thick by way of example and a metal nitride film 14 which is a titanium nitride (TiN) film about 1000 Å thick by way of example are provided for the same purpose as in Embodiment I. An inter-layer insulator film 24 made of an $SiO_2$ film is formed on the whole surface of the resulting $p^{--}$-type Si substrate 1, and it is selectively etched, whereby contact holes 12B are provided in predetermined parts. Wiring layers 15 made of Al-Si-alloy films by way of example are provided, and are respectively connected to the metal nitride films 14 through the contact holes 12B. The wiring layers 15 selectively connect the electrodes of elements. As in Embodiment I, the lead-out electrodes constructed of the polycrystalline Si films 11A, 11B, metal silicide films 13 and metal nitride films 14 have excellent refractory characteristics and stabilize the contact resistances of the wiring layers 15 made of the Al-Si-alloy films. A protective film 25 which is made of a multilayer film consisting of an SOG film and a PSG film by way of example is provided on the wiring layers 15, etc.

Next, a method of manufacturing the CMOSFETs according to Embodiment II will be described.

As illustrated in the drawing, an n-type well region 16, a field insulator film 9, gate insulator films 17, gate electrodes 18, $p^-$-type diffused layers 19, $n^-$-type diffused layers 20, side walls 21, $p^+$-type diffused layers 22 and $n^+$-type diffused layers 23 are successively formed by well-known processes for producing MOSFETs. Thereafter, a polycrystalline silicon film for forming p-type polycrystalline silicon films 11A and n-type polycrystalline silicon films 11B is formed on the whole surface of the resulting $p^-$-type Si substrate 1 by, e.g., CVD, and impurities such as boron (B) and phosphorus (P) are respectively diffused into the selected parts of the polycrystalline silicon film formed. After the selective diffusion of the impurities, a metal silicide film made of platinum silicide and a metal nitride film made of titanium nitride are successively stacked and formed on the whole surface of the polycrystalline silicon film by the same method as in Embodiment I. Further, the selected parts of the metal nitride film, metal silicide film and polycrystalline silicon film formed as described above are continuously etched by, for example, anisotropic dry etching, to thereby form source and drain lead-out electrodes made up of the polycrystalline silicon films 11A, 11B, metal silicide film 13 and metal nitride film 14. Thenceforth, inter-layer insulator films 24 made of $SiO_2$, wiring layers 15 made of an Al-Si alloy, and a protective film 25 consisting of an SOG film and a PSG film are successively formed by well-known processes, whereby intended CMOSFETs are produced.

Although, in the above, the invention made by the inventors has been specifically described in conjunction with the embodiments illustrated, it is not to be construed as being limited to the disclosed embodiments, but that it may include various other embodiments including obvious variations of the embodiments disclosed without departing from the spirit and scope thereof.

By way of example, while the g embodiments have referred to the cases of applying the present invention to bipolar LSI and the CMOSFETs which employ the boron-doped polycrystalline Si film 11 for leading out the base, the present invention is also applicable to a case as explained below. As already stated, a polycrystalline Si film doped with phosphorus or arsenic is more liable to effect in the growth of crystal grains than that of a polycrystalline Si film doped with boron. However, when the phosphorus or arsenic-doped polycrystalline Si film has the quantity of doping set smaller than the limit of solid-solubility of the impurity in Si to the end of using the film as, for example, a resistance element, it is difficult to undergo a growth of crystal grains similar to the boron-doped polycrystalline Si film, and the sizes of the crystal grains sometimes have values which are smaller than the thickness of the polycrystalline Si film by way of example. Even in the case of forming an electrode on such a polycrystalline Si film doped with phosphorus or arsenic below the limit of solid-solubility, the present invention can be applied and can thus enhance the refractory characteristics of the electrode.

In addition, the present invention can be applied to bipolar LSIs not having the SICOS structure and also to various semiconductor devices other than bipolar LSIs.

What is claimed is:

1. A semiconductor integrated circuit device comprising:
   - a semiconductor substrate having a main surface;
   - a thick oxide film selectively formed on said main surface so as to surround an active region in which a base, an emitter and collector regions of a bipolar transistor become formed;
   - a base lead-out electrode made of a polycrystalline silicon film which is doped with boron being electrically connected to the base region of said bipolar transistor;
   - an insulating film being formed on an upper surface of at least said base lead-out electrode so as to cover at least said base lead-out electrode;
   - a contact hole being formed through said insulating film at lest at above the location wherein the upper surface of said base lead-out electrode is formed;
   - a metal silicide film being formed on the upper surface of said base lead-out electrode at the location where said contact hole is formed;
   - a titanium nitride film being formed on said metal silicide film; and
   - a wiring layer made of a material whose principal component is aluminum being formed on said titaniun nitride film and being electrically connected to said base lead-out electrode via said titanium nitride and metal silicide films.

2. A semiconductor integrated circuit device according to claim 1, wherein said metal silicide film comprises one of a platinum silicide film and a palladium silicide film.

3. A semiconductor integrated circuit device according to claim 1, wherein said wiring layer is made of an Al-Si alloy films.

4. A semiconductor integrated circuit device according to claim 1, wherein said thick oxide film is a field oxidation film.

5. A semiconductor integrated circuit device according to claim 1, wherein a portion of said titanium nitride film is formed on said insulating film so as to completely cover surfaces of said insulating film associated with the forming of said contact hole.

6. A semiconductor integrated circuit device according to claim 5, wherein said wiring layer which is disposed on said titanium nitride film is patterned according to the formed pattern of said titanium nitride film.

7. A semiconductor integrated circuit device according to claim 6, wherein said titanium nitride film extends over an upper corner surface of said contact hole thereby partially covering said insulating film, and said wiring layer being patterned so as to be formed directly on said titanium nitride film which is within the periphery of said contact hole and on that part thereof which extends over the corner surface of said contact hole.

8. A semiconductor integrated circuit device according to claim 5, wherein said titanium nitride film extends over an upper corner surface of said contact hole thereby partially covering said insulating film, and said wiring layer being patterned so as to be formed directly on said titanium nitride film which is within the periphery of said contact hole and on that part thereof which extends over the corner surface of said contact hole 9. A semiconductor integrated circuit device according to claim 1, further comprising:

an emitter electrode formed from said wiring layer and which is electrically connected to the emitter region of said bipolar transistor at another contact hole through said insulating film and via a metal silicide film which is formed on said emitter region and a titanium nitride film formed thereon, said emitter electrode being extended over said base lead-out electrode.

10. A semiconductor integrated circuit device according to claim 9, further comprising:

a collector lead-out region which electrically couples a collector electrode formed from said wiring layer, via a metal silicide film and a titanium nitride film, and the collector region of said bipolar transistor through a buried layer region, wherein said active region in which the base, emitter and collector regions of said bipolar transistor are formed corresponds to a mesa region of an epitaxial layer.

11. A semiconductor integrated circuit device according to claim 10, wherein said metal silicide film comprises one of a platinum silicide film and a palladium silicide film.

12. A semiconductor integrated circuit device according to claim 11, wherein said wiring layer is made of an Al-Si alloy film.

13. A semiconductor integrated circuit device according to claim 12, wherein said thick oxide film is a field oxidation film.

14. A semiconductor integrated circuit device according to claim 13, wherein a portion of said titanium nitride film is formed on said insulating film so as to completely cover surfaces of said insulating film associated with the forming of said contact hole.

15. A semiconductor integrated circuit device according to claim 14, wherein said wiring layer which is disposed on said titanium nitride film is patterned according to the formed pattern of said titanium nitride film.

16. A semiconductor integrated circuit device according to claim 15, wherein said titanium nitride film extends over an upper corner surface of said contact hole thereby partially covering said insulating film, and said wiring layer being patterned so as to be formed directly on said titanium nitride film which is within the periphery of said contact hole and on that part thereof which extends over the corner surface of said contact hole.

17. In a semiconductor integrated circuit device comprising a semiconductor substrate which has a main surface; a thick oxide film selectively formed on said main surface so as to surround an active mesa region in which a base, emitter and collector regions of a bipolar transistor become formed; and a base lead-out electrode made of a polycrystalline silicon film which is doped with boron and which is electrically connected to the base region of said bipolar transistor wherein, as a result thereof, there is further included:

an insulating film being formed on an upper surface of at least said base lead-out electrode so as to cover at least said base lead-out electrode;

a contact hole being formed through said insulating film at least at above the location wherein the upper surface of said base lead-out electrode is formed;

a metal silicide film being formed on the upper surface of said base lead-out electrode at the location where said contact hole is formed;

a titanium nitride film being formed on said metal silicide film; and a wiring layer made of a material whose principal component is aluminum being formed on said titanium nitride film and being electrically connected to said base lead-out electrode via said titanium nitride and metal silicide films.

18. A semiconductor integrated circuit device according to claim 17, wherein said wiring layer is made of an Al-Si alloy film.

19. A semiconductor integrated circuit device according to claim 18, wherein said metal silicide film comprises one of a platinum silicide film and a palladium silicide film.

20. A semiconductor integrated circuit device according to claim 19, wherein said thick oxide film is a field oxidation film.

21. A semiconductor integrated circuit device according to claim 20, wherein a portion of said titanium nitride film is formed on said insulating film so as to completely cover surfaces of said insulating film associated with the forming of said contact hole.

22. A semiconductor integrated circuit device according to claim 21, wherein said wiring layer which is disposed on said titanium nitride film is patterned according to the formed pattern of said titanium nitride film.

23. A semiconductor integrated circuit device according to claim 22, wherein said titanium nitride film extends over an upper corner surface of said contact hole thereby partially covering said insulating film, and said wiring layer being patterned so as to be formed directly on said titanium nitride film which is within the periphery of said contact hole and on that part thereof which extends over the corner surface of said contact hole.

24. A semiconductor integrated circuit device comprising:

a semiconductor substrate having a main surface with an active region in which a base, an emitter and collector regions of a bipolar transistor become formed;

a base lead-out electrode made of a polycrystalline silicon film which is doped with boron being electrically connected to the base region of said bipolar transistor, said base lead-out electrode having an upper surface;

an insulating film with a contact hole being formed on the upper surface of at least said base electrode so as to cover at least said base lead-out electrode, said contact hole being formed at least at the location wherein the upper surface of said lead-out electrode is formed;

a metal silicide film being formed on the upper surface of said lead-out electrode at the location wherein said contact hole is formed;

a titanium nitride film being formed on said metal silicide film; and a wiring layer made of a material whose principal component is an aluminum being formed on said titanium nitride film and being electrically connected to said base lead-out electrode via said titanium nitride film and metal silicide film.

25. A semiconductor integrated circuit device comprising:

a semiconductor substrate having a main surface;

a base, an emitter and collector regions of a bipolar transistor being formed on said main surface;

a base lead-out electrode made of a polycrystalline silicon film which is doped with boron being electrically connected to the base region of said bipolar transistor, said base lead-out electrode having an upper surface;

a wiring layer made of a material whose principal component is an aluminum being formed over the upper surface of said base lead-out electrode;

a titanium nitride film formed between said base lead-out electrode and said wiring layer; and wherein said wiring layer is electrically connected to said base lead-out electrode via said titanium nitride film.

26. A semiconductor integrated circuit device according to claim 25, further comprising:

a metal silicide film being formed between said titanium nitride film and said base lead-out electrode, wherein said wiring layer is electrically connected to said base lead-out electrode via said titanium nitride film and said metal silicide film.

27. A semiconductor integrated circuit device according to claim 25, further comprising:

an insulating film with a contact hole being formed on the upper surface of at least said base lead-out electrode so as to cover at least said base lead-out electrode, said contact hole being formed at the location where the upper surface of said base lead-out electrode is formed; wherein a portion of said titanium nitride film is formed on said insulating film so as to cover surfaces of said insulating film associated with the forming of said contact hole.

28. A semiconductor integrated circuit device according to claim 27, wherein said wiring layer is disposed on said titanium nitride film is patterned according to the formed pattern of said titanium nitride film.

29. A semiconductor integrated circuit device according to claim 28, wherein said titanium nitride film extends over an upper corner surface of said contact hole thereby partially covering said insulating film, and wherein said wiring layer is patterned so as to be formed directly on said titanium nitride film which is within the periphery of said contact hole and on that part thereof which extends over the corner surface of said contact hole.

30. A semiconductor integrated circuit device according to claim 29, further comprising:

a metal silicide film being formed between said titanium nitride film and said base lead-out electrode, wherein said wiring layer is electrically connected to said base lead-out electrode via said titanium nitride film and said metal silicide film.

31. A semiconductor integrated circuit device according to claim 30, wherein said metal silicide film is formed within said contact hole.

32. A semiconductor integrated circuit device according to claim 25, wherein said wiring layer is made of an Al-Si alloy film.

33. A semiconductor integrated circuit device according to claim 25, further including a thick oxide film formed on said main surface so as to surround an active region correspondingly associated with the base, emitter and collector regions of said bipolar transistor.

34. A semiconductor integrated circuit device according to claim 33, wherein said thick oxide film is a field oxidation film.

35. A semiconductor integrated circuit device comprising:

a semiconductor body being comprises of a semiconductor substrate of a first conductivity type, a mesa region of an epitaxial layer of a second conductivity type, opposite to said first conductivity type, over said substrate and a buried semiconductor region of said second conductivity type between said substrate and mesa region of said epitaxial layer, said mesa region having an upper and a side surface;

a thick oxide film formed on an upper surface of said substrate so as to surround said mesa region;

a base region of a bipolar transistor formed in said mesa region, said base region being at least extended to a corner portion of said mesa region defined by said upper and side surfaces of said mesa region and being of said first conductivity type;

a base lead-out electrode made of a polycrystalline silicon film which is doped with boron over said thick oxide film, said base lead-out electrode being contacted to the corner portion of said mesa region and electrically connected to said base region of said bipolar transistor, and said base lead-out electrode having an upper surface;

an insulating film with a contact hole being formed on the upper surface of said base lead-out electrode so as to cover said base lead-out electrode, said contact hole being formed at least at the location wherein the upper surface of said lead-out electrode is formed;

a titanium nitride film being formed over the upper surface of said base lead-out electrode at the location where said contact hole is formed; and a wiring layer made of a material whose principal component is aluminum being formed on said titanium nitride film and being electrically connected to said base lead-out electrode via said titanium nitride film.

36. A semiconductor integrated circuit device according to claim 35, further comprising:

a metal silicide film being formed between said titanium nitride film and said base lead-out electrode, wherein said wiring layer is electrically connected to said base lead-out electrode via said titanium nitride film and said metal silicide film.

37. A semiconductor integrated circuit device according to claim 36, wherein a portion of said titanium nitride film is formed on said insulation film so as to cover surfaces of said insulation film associated with the forming of said contact hole.

38. A semiconductor integrated circuit device according to claim 37, wherein said wiring layer which is disposed on said titanium nitride film is patterned according to the formed pattern of said titanium nitride film.

39. A semiconductor integrated circuit device according to claim 38, wherein said titanium nitride film extends over an upper corner surface of said contact hole thereby partially covering said insulating film, and said wiring layer being patterned so as to be formed directly on said titanium nitride film which is within the periphery of said contact hole and on that part thereof which extends over the upper corner surface of said contact hole.

40. A semiconductor integrated circuit device according to claim 35, wherein said wiring layer is made of an Al-Si alloy film.

41. A semiconductor integrated circuit device according to claim 35, wherein said thick oxide film is a field oxidation film.

42. A semiconductor integrated circuit device according to claim 35, further comprising:

a collector lead-out semiconductor region of said bipolar transistor, of said second conductivity type formed in said mesa region of said epitaxial layer, said collector lead-out semiconductor region being separated from said base region and being contracted to said buried semiconductor region, wherein a collector region of said bipolar transistor comprises a region in said mesa region of said epitaxial layer, said buried semiconductor region and said collector lead-out semiconductor region.

43. A semiconductor integrated circuit device according to claim 35, further comprising:

an emitter region of said bipolar transistor formed in said base region;

an emitter lead-out electrode made of a polycrystalline silicon film which is doped with arsenic being electrically connected to said emitter region, said emitter lead-out electrode being extended on said emitter region and being extended over said base lead-out electrode; and an emitter electrode formed from said wiring layer and which is electrically connected to said emitter region of said bipolar transistor at another contact hole through said insulating film and via a titanium nitride film which is formed on said emitter lead-out electrode.

* * * * *